United States Patent
Ikenaga (10) Patent No.: US 9,342,302 B2
(45) Date of Patent: May 17, 2016

(54) INFORMATION PROCESSING SYSTEMS AND METHODS FOR DETERMINING AN OUTPUT FORMAT FOR REQUESTED DATA

(75) Inventor: Toshiya Ikenaga, Tokyo (JP)

(73) Assignees: Sony Corporation, Tokyo (JP); Sony Interactive Entertainment Inc., Tokyo (JP)

( * ) Notice: Subject to any disclaimer, the term of this patent is extended or adjusted under 35 U.S.C. 154(b) by 917 days.

(21) Appl. No.: 13/291,237

(22) Filed: Nov. 8, 2011

(65) Prior Publication Data

US 2012/0158883 A1 Jun. 21, 2012

(30) Foreign Application Priority Data

Dec. 16, 2010 (JP) ................. 2010-280450

(51) Int. Cl.
| | | |
|---|---|---|
| G06F 15/167 | (2006.01) | |
| G06F 9/06 | (2006.01) | |
| G06F 17/30 | (2006.01) | |
| H03M 7/30 | (2006.01) | |
| H04L 29/06 | (2006.01) | |
| H04L 29/08 | (2006.01) | |
| A63F 13/30 | (2014.01) | |

(52) U.S. Cl.
CPC . *G06F 9/06* (2013.01); *A63F 13/12* (2013.01); *G06F 17/30238* (2013.01); *H03M 7/30* (2013.01); *H04L 67/1097* (2013.01); *H04L 69/04* (2013.01); *A63F 2300/534* (2013.01); *A63F 2300/538* (2013.01); *A63F 2300/552* (2013.01)

(58) Field of Classification Search
CPC . H04L 67/2828; H04L 67/1097; H04L 69/04; A63F 13/12; H03M 7/30

USPC .................................................. 709/217, 247
See application file for complete search history.

(56) References Cited

U.S. PATENT DOCUMENTS

| | | | | |
|---|---|---|---|---|
| 5,978,492 | A | | 11/1999 | Furuhashi |
| 5,996,022 | A | * | 11/1999 | Krueger et al. ............... 709/247 |
| 6,792,476 | B1 | * | 9/2004 | Iwatsu .................. G06F 13/102 |
| | | | | 348/316 |
| 7,113,456 | B2 | * | 9/2006 | Kusano et al. ............. 369/30.09 |
| 7,197,661 | B1 | * | 3/2007 | Reynolds ............ H04L 41/0654 |
| | | | | 714/4.4 |
| 8,090,764 | B2 | * | 1/2012 | Sato et al. ..................... 709/203 |
| 8,386,608 | B1 | * | 2/2013 | Rankov ..................... G06F 9/54 |
| | | | | 709/217 |
| 8,930,666 | B1 | * | 1/2015 | Richardson ............... G06F 3/06 |
| | | | | 711/112 |
| 2002/0113805 | A1 | * | 8/2002 | Li .......................... G06T 15/20 |
| | | | | 345/649 |
| 2002/0138278 | A1 | * | 9/2002 | Reinold et al. ................ 704/500 |
| 2003/0041123 | A1 | * | 2/2003 | Sato et al. ..................... 709/219 |
| 2005/0278729 | A1 | * | 12/2005 | Lamkin et al. ............... 719/328 |
| 2007/0185977 | A1 | * | 8/2007 | Sato et al. ..................... 709/219 |
| 2008/0144826 | A1 | * | 6/2008 | Chang .................. G06F 21/602 |
| | | | | 380/269 |
| 2009/0129643 | A1 | * | 5/2009 | Natanzon ............. G06F 19/321 |
| | | | | 382/128 |
| 2009/0193040 | A1 | * | 7/2009 | Provencal ............... H03M 7/30 |

(Continued)

*Primary Examiner* — Jerry Dennison (74) *Attorney, Agent, or Firm* — Matthew B. Dernier, Esq.

(57) ABSTRACT

An information processing device includes a receiving unit (54) configured to receive a reading instruction to read a part of a data file, the part containing less data than the data file; a data obtaining unit (60) configured to obtain the part designated by the reading instruction from an external storage device connected via a network; and a data output unit (66) configured to output the part designated by the reading instruction, wherein when the reading instruction is a reading instruction to read the part and the part is stored compressed in the external storage device connected via the network, the data obtaining unit (60) obtains the part, compressed, designated by the reading instruction, and the data output unit (66) outputs data obtained by expanding the compressed part.

16 Claims, 4 Drawing Sheets

(56) References Cited

U.S. PATENT DOCUMENTS

2010/0050170 A1* 2/2010 Parikh .................. G06F 9/45537 718/1
2010/0226225 A1* 9/2010 Kashii .................... G11B 20/10 369/47.32
2012/0092345 A1* 4/2012 Joshi ..................... G06F 17/214 345/471
2012/0121175 A1* 5/2012 Narayanan .............. G06T 9/007 382/166
2013/0080566 A1* 3/2013 Kukreja ................ G06F 9/4443 709/213
2013/0111196 A1* 5/2013 Pasam ................... G06F 21/575 713/1

* cited by examiner

FIG.2

INFORMATION PROCESSING SYSTEMS AND METHODS FOR DETERMINING AN OUTPUT FORMAT FOR REQUESTED DATA

CROSS-REFERENCE TO RELATED APPLICATIONS

The present application claims priority from Japanese application JP 2010-280450 filed on Dec. 16, 2010, the content of which is hereby incorporated by reference into this application.

BACKGROUND OF THE INVENTION

1. Field of the Invention

The present invention relates to an information processing device, an information processing system, an information processing method, and an information storage medium.

2. Description of the Related Art

There has been available an information storage medium for storing a game program in which audio data, such as BGM or the like, for use in a game is recorded in an area formatted according to a CD-DA (Compact Disc Digital Audio) format which is an audio data standard for music CD s (hereinafter referred to as a CD-DA area). U.S. Pat. No. 5,978,492 discloses a CD-ROM in which an application program such as a game program or the like, an image, and audio data, are recorded.

SUMMARY OF THE INVENTION

For example, when an information processing device is modified so as to read data from a device connected thereto via a network, such as the Internet or the like, rather than an information storage medium, such as a CD-ROM or the like, data read is transmitted through the network. In this case, reading of data having a large volume may increase the possibility of bandwidth tightening in the network.

In the above, the possibility of bandwidth tightening in the network can be reduced by compressing all of the data to be possibly read before storing the data in a device connected via the network. However, such an arrangement forces data expansion of all of the data read on an image processing device, which increases a processing load in the information processing device.

If it is possible to change a processing to be executed, depending on whether or not data to be read is stored in an area formatted according to the CD-DA format, variation of a feasible information processing is widened.

The present invention has been conceived in view of the above, and one of the objects thereof is to reduce the possibility of bandwidth tightening in a network due to data reading from a device connected via the network, while reducing increase of a processing load.

Another object of the present invention to widen variation of a feasible information processing by changing a processing to be executed, depending on whether or not data to be read is stored in an area formatted according to the CD-DA format.

In order to achieve the above described objects, according to one aspect of the present invention, there is provided an information processing device, comprising a receiving unit for receiving a reading instruction to read data; a data obtaining unit for obtaining data designated by the reading instruction from an external storage device connected via a network; and a data output unit for outputting the data designated by the reading instruction, wherein when the reading instruction is a reading instruction to read data stored compressed in the external storage device connected via the network, the data obtaining unit obtains compressed data designated by the reading instruction, and the data output unit outputs data obtained by expanding the compressed data.

According to another aspect of the present invention, there is provided an information processing system, comprising an information processing device and an external storage device, both connected via a network, wherein the external storage device includes a unit for storing an image file of an information storage medium in which data allocated in a specific area in the information storage medium is stored compressed and data allocated in an area other than the specific area in the information storage medium is stored not compressed; an output request receiving unit for receiving an output request for outputting data, from the information processing device; and a data output unit for outputting the data stored in the image file to the information processing device in response to the output request, the information processing device includes a receiving unit for receiving a reading instruction to read data; a request output unit for outputting an output request for outputting data designated by the reading instruction to the external storage device; a data obtaining unit for obtaining the data output from the external storage device; and a data output unit for outputting the data designated by the reading instruction, and when the reading instruction is a reading instruction to read data stored compressed in the external storage device connected via the network, the request output unit of the information processing device outputs an output request for outputting compressed data to the external storage device, and the data output unit of the external storage device outputs the compressed data to the information processing device, the data obtaining unit of the information processing device obtains the compressed data, and the data output unit of the information processing device outputs data obtained by expanding the compressed data.

According to another aspect of the present invention, there is provided an information processing method, comprising a receiving step of receiving a reading instruction to read data; a data obtaining step of obtaining data designated by the reading instruction from an external storage device connected via a network; and a data output step of outputting the data designated by the reading instruction, wherein when the reading instruction is a reading instruction to read data stored compressed in the external storage device connected via the network, compressed data designated by the reading instruction is obtained at the data obtaining step, and data obtained by expanding the compressed data is output at the data output step.

According to another aspect of the present invention, there is provided a non-transitory computer-readable information storage medium storing a program for causing a computer to function as a receiving unit for receiving a reading instruction to read data; a data obtaining unit for obtaining data designated by the reading instruction from an external storage device connected via a network; and a data output unit for outputting the data designated by the reading instruction, wherein when the reading instruction is a reading instruction to read data stored compressed in the external storage device connected via the network, the data obtaining unit obtains compressed data designated by the reading instruction, and the data output unit outputs data obtained by expanding the compressed data.

According to the present invention, upon receipt of an instruction to read data stored compressed in an external storage device connected via a network, the compressed data is obtained via the network, and data obtained by expanding the compressed data is output. This can reduce the possibility of bandwidth tightening in the network due to data reading from a device connected via the network, while also reducing increase of a processing load.

In one embodiment of the present invention, an image file of an information storage medium where data allocated in a specific area in the information storage medium is stored compressed, and data allocated in an area other than the specific area is stored not compressed, may be stored in the external storage device, the receiving unit may receive a reading instruction to read data in the image file, and when the reading instruction is a reading instruction to read the data stored in the specific area, the data obtaining unit may obtain compressed data designated by the reading instruction, and the data output unit may output data obtained by expanding the compressed data.

In one embodiment of the present invention, the data output unit may switch between outputting data stored in the external storage device and outputting data stored in the information processing device according to a configuration.

In one embodiment of the present invention, the information processing device may further comprise an expansion unit for expanding the compressed data obtained by the data obtaining unit when the reading instruction is a reading instruction to read data stored compressed in the external storage device connected via the network, wherein when the reading instruction is a reading instruction to read data stored compressed in the external storage device connected via the network, the data output unit may output data expanded by the expansion unit.

In one embodiment of the present invention, the information processing device and the external storage device may be connected to each other via the Internet, the information processing device may further comprise a conversion unit for converting an address of the data designated by the reading instruction into a parameter in a request according to an Internet protocol, and a request output unit for outputting the request according to the Internet protocol containing the parameter to the external storage device, and the data obtaining unit may obtain data output from the external storage device in response to the request.

According to still another aspect of present invention, there is provided an information processing device, comprising a receiving unit for receiving a reading instruction to read data; a data obtaining unit for obtaining data designated by the reading instruction from an external storage device storing an image file of a CD and connected via a network; and an executing unit for executing a processing with respect to the data designated by the reading instruction, wherein the executing unit changes a processing to be executed, depending on whether or not the reading instruction is a reading instruction to read data in an area formatted according to a CD-DA format in the image file According to still another aspect of the present invention, there is provided an information processing system, comprising an information processing device and an external storage device, both connected via a network, wherein the external storage device includes a unit for storing an image file of a CD; an output request receiving unit for receiving an output request for outputting data, from the information processing device; and a data output unit for outputting data stored in the image file to the information processing device in response to the output request, the information processing device includes a receiving unit for receiving a reading instruction to read data; a request output unit for outputting an output request for outputting data designated by the reading instruction to the external storage device; a data obtaining unit for obtaining the data output from the external storage device; and an executing unit for executing a processing with respect to the data designated by the reading unit, and the executing unit changes a processing to be executed, depending on whether or not the reading instruction is a reading instruction to read data in an area formatted according to a CD-DA format in the image file.

According to still another aspect of the present invention, there is provided an information processing method, comprising a receiving step of receiving a reading instruction to read data; a data obtaining step of obtaining data designated by the reading instruction from an external storage device storing an image file of a CD and connected via a network; and an executing step of executing a processing with respect to the data designated by the reading instruction, wherein a processing to be executed is changed at the executing step, depending on whether or not the reading instruction is a reading instruction to read data in an area formatted according to a CD-DA format in the image file.

According to still another aspect of the present invention, there is provided a non-transitory computer-readable information storage medium storing a program for causing a computer to function as a receiving unit for receiving a reading instruction to read data; a data obtaining unit for obtaining the data designated by the reading instruction from an external storage device storing an image file of a CD and connected via a network; and an executing unit for executing a processing with respect to the data designated by the reading instruction, wherein the executing unit changes a processing to be executed, depending on whether or not the reading instruction is a reading instruction to read data in an area formatted according to a CD-DA format in the image file.

According to the present invention, by changing a processing to be executed, depending on whether or not data to be read is stored in an area formatted according to the CD-DA format, variation in feasible information processing can be widened.

In one embodiment of the present invention, the data in the area formatted according to the CD-DA format in the image file may be stored compressed in the external storage device, and when the reading instruction is a reading instruction to read data in an area formatted according to the CD-DA format in the image file, the data obtaining unit may obtain compressed data designated by the reading instruction, and the executing means may output data obtained by expanding the compressed data.

DETAILED DESCRIPTION OF THE INVENTION

In the following, one embodiment of the present invention will be described in detail with reference to the accompanying drawings.

Figure 1:
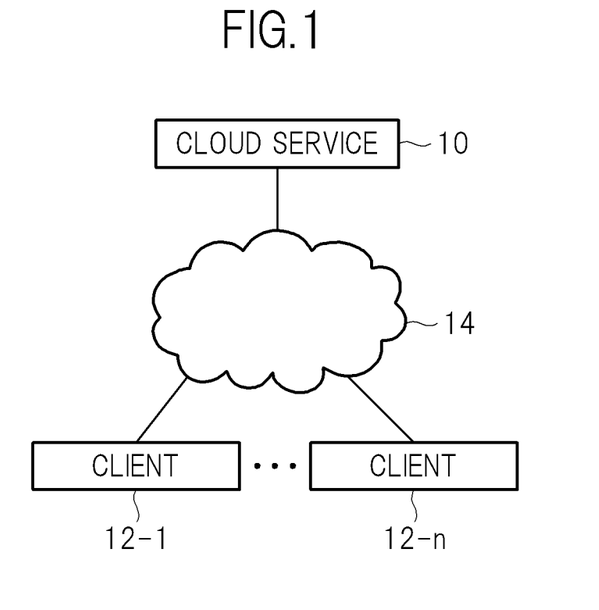
FIG. 1 is a diagram showing one example of an overall structure of a computer network according to this embodiment.

FIG. 1 is a diagram showing one example of a overall structure of a computer network according to this embodiment of the present invention. As shown in FIG. 1, a cloud service 10 and a client 12 (12-1 to 12-n), each being constituted with a computer mainly, are connected to a computer network 14, such as the Internet. The cloud service 10 and the client 12 can communicate with each other. In this embodiment, the cloud service 10 functions as an external storage device, while the client 12 functions as an information processing device. Moreover, in this embodiment, the cloud service 10 and the client 12 as a whole function as an information processing system.

The client 12 is a computer used by a user of the cloud service 10, being, e.g., a personal computer, a game console, a television set, a portable game device, a portable information terminal, and so forth. The client 12 comprises e.g., a control device, such as a CPU, a memory device, such as a memory element (e.g., a ROM, a RAM, or the like) and a hard disk drive, an output device, such as a display and a speaker, a game controller, an input device, such as a touch pad, a mouse, a keyboard, and a microphone, and a communication device, such as a network board.

The cloud service 10 is, e.g., an distributed computing environment, and comprises a plurality of Web application servers, a plurality of database servers, a plurality of storage devices, and so forth, these being connected so as to be mutually communicable. A server included in the cloud service 10 comprises, e.g., a control unit, such as a CPU, a memory device, such as a memory element (e.g., a ROM, a RAM, or the like) and a hard disk drive, and a communication unit, or a communication interface, such as a network board. These components are connected to one another via a bus.

The client 12 using the cloud service 10 can use various services provided by the cloud service 10 without particularly being aware of the position of resources such as servers or a storage devices in the cloud service 10.

Figure 2:
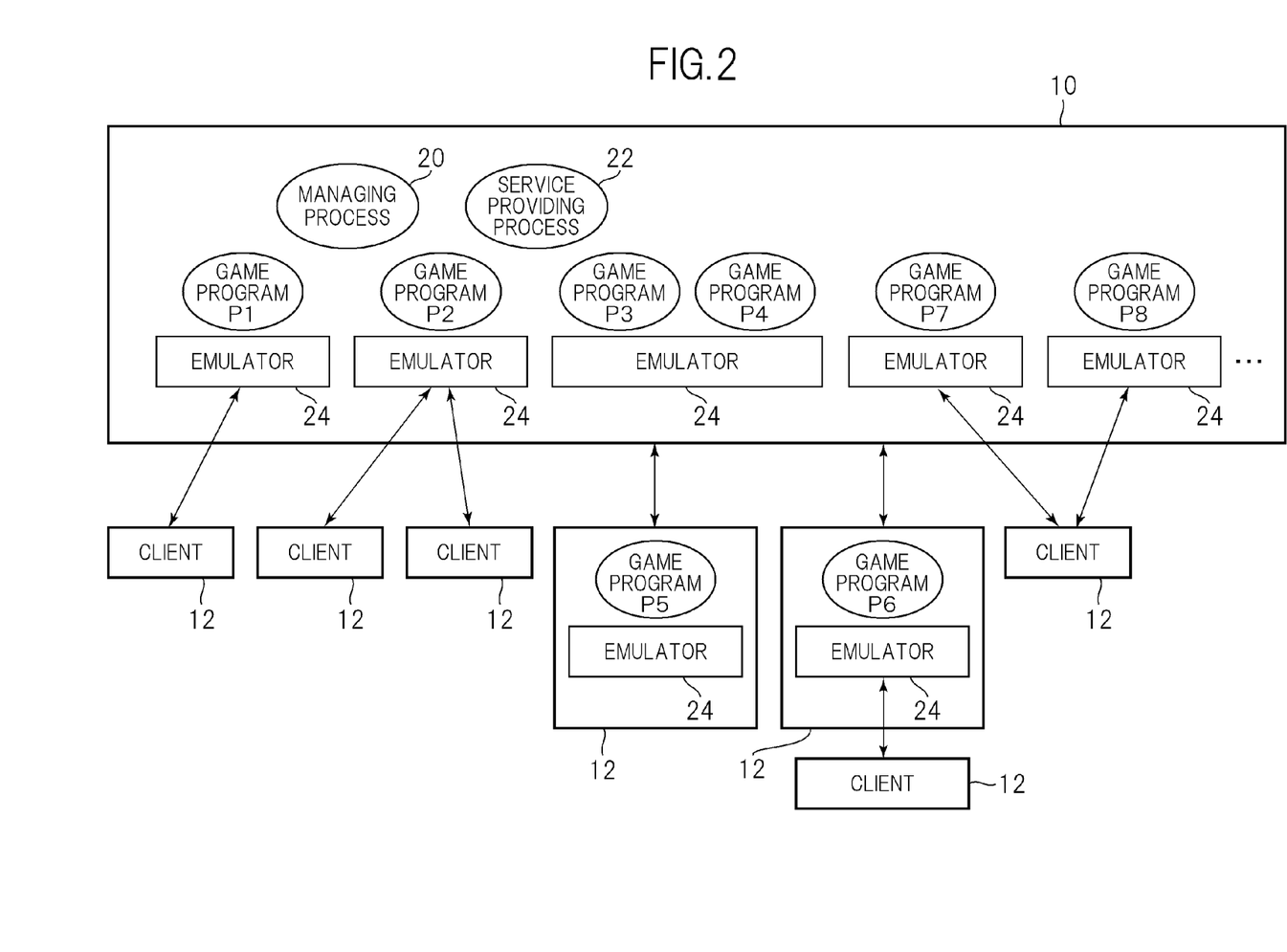
FIG. 2 is a conceptual diagram showing one example relationship between a cloud service and a client according to this embodiment.

FIG. 2 is a conceptual diagram showing an example relationship between the cloud service 10 and the client 12 according to this embodiment. In the cloud service 10 according to this embodiment, for example, a managing process 20, a service providing process 22, and an emulator 24 are executed. Further, an image file (disk image) of an information storage medium, such as a CD-ROM, is stored in advance in the memory device, such as a storage device, included in the cloud service 10. The image file contains, e.g., a game program, image data, audio data, and so forth. In this embodiment, among the audio data, data on music, such as BGM or the like is compressed according to, e.g., AAC (Advanced Audio Coding) format, and stored in a specific area in the image file (e.g., a CD-DA area formatted in CD-DA format).

The service providing process 22 is a process generated by, e.g., a server included in the cloud service 10 by starting a program for realizing various services, including a shopping site, an SNS (Social Networking Service), and so forth.

The managing process 20 is a process generated by, e.g., a server included in the cloud service 10 by starting a management program installed in the server or a storage device included in the cloud service 10, for executing location management of the emulator 24, starting and stopping of the emulator 24, connection and disconnection between the client 12 and the emulator 24 in response to a request from the client 12, and so forth.

The emulator 24 is a process of functioning as, e.g., a virtual machine for executing a game program stored in a server or a storage device included in the cloud service 10, and generated by the managing process 20 by starting an emulator program installed in a server or a storage device included in the cloud service 10, in response to a request from the client 12. The managing process 20 reads an image file of a game program designated by the client 12 and loads into the emulator 24 in response to a request from the client 12. Then, the game program is executed in the emulator 24. Note that, alternatively, the emulator 24 may load a game program designated by the client 12 through its own process.

In response to a request from the client 12 or the managing process 20, the emulator 24 outputs, e.g., an emulated memory image and an emulated register (e.g., a program counter or the like) which is managed by the emulator 24, an input/output access log of a game program to be operated in the emulator 24, a log of a CPU instruction and a GPU instruction to be executed in the emulator 24, and so forth.

In this embodiment, as shown in FIG. 2, one client 12 can exclusively use one emulator 24 (see game program P1). Alternatively, two or more clients 12 can be connected to one emulator 24 (see game program P2). Further, two or more game programs can be executed over one emulator 24 (see game programs P3, P4).

In this embodiment, an emulator program is installed in each client 12. In response to a request from the client 12, the managing process 20 outputs to the client 12 an instruction to start or stop the emulator 24. In response to the start instruction from the managing process 20, the client 12 starts the emulator program installed therein, and in response to a stop instruction from the managing process 20, the client 12 stops the emulator 24 which is running. With the above, a game program stored in the client 12 can be executed in the emulator 24 being executed in the client 12 (see game program P5). Further, the emulator 24 executed in the client 12 can be connected by another client 12 (see game program P6).

In this embodiment, as shown in FIG. 2, one client 12 can be connected to two or more emulators 24 (see game programs P7, P8).

Figure 3:
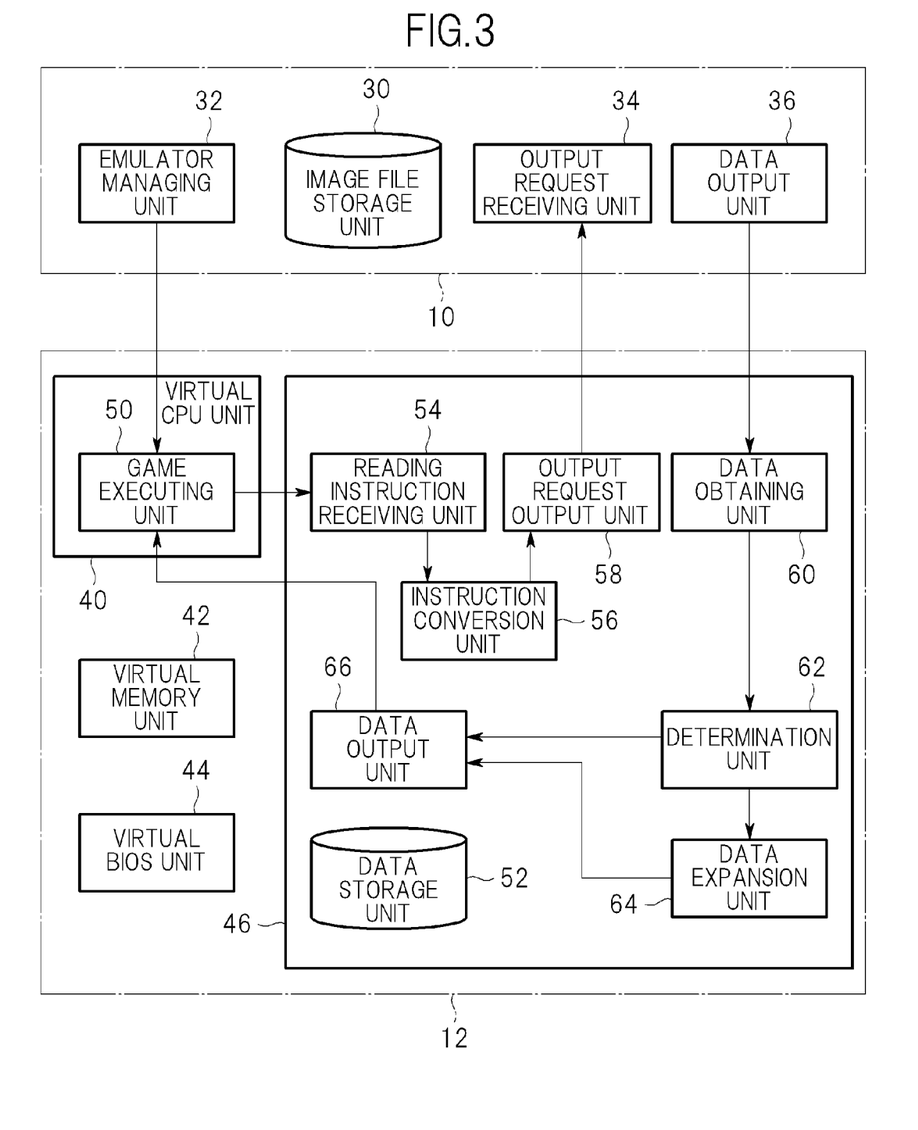
FIG. 3 is a functional block diagram showing example functions realized in the cloud service and the client according to this embodiment.

FIG. 3 is a functional block diagram showing example functions realized in the cloud service 10 and the client 12 according to this embodiment. Note that the functions shown in FIG. 3 are only those related to the following description, and functions other than those shown in FIG. 3 are also realized in the cloud service 10 and the client 12 according to this embodiment.

As shown in FIG. 3, the cloud service 10 according to this embodiment functionally comprises, e.g., an image file storage unit 30, an emulator managing unit 32, an output request receiving unit 34, and a data output unit 36. The image file storage unit 30 is realized mainly utilizing, e.g., a memory device, such as a memory, a hard disk drive, a storage device and so forth, included in a server included in the cloud service 10. Other components correspond to functions realized in, e.g., the managing process 20.

As shown in FIG. 3, the client 12 according to this embodiment functionally comprises, e.g., a virtual CPU unit 40, or an emulated CPU, a virtual memory unit 42, or an emulated memory, a virtual BIOS unit 44, or an emulated ROM where a BIOS program is stored, and a virtual CD-ROM drive unit 46, or an emulated CD-ROM drive. These components correspond to functions realized in, e.g., the emulator 24 being executed in the client 12. In this embodiment, the virtual CD-ROM drive unit 46 outputs data designated by a data reading instruction received from the virtual CPU unit 40 (e.g., data stored in a memory device of the client 12, data stored in a memory device of the cloud service 10, and so forth).

Note that there are various variations in correspondence relationship between the above described components and physical devices depending on the implementation of the emulator 24. In this embodiment, e.g., the virtual CPU unit 40 is physically realized mainly using the control device and the memory device of the client 12, and, e.g., the virtual CD-ROM drive unit 46 is physically realized, mainly using the control device, the memory device, and the communication device of the client 12. Further, e.g., the virtual memory unit 42 and the virtual BIOS unit 44 are physically realized, mainly using the memory device of the client 12 in this embodiment.

The virtual CPU unit 40 includes a game executing unit 50 in this embodiment. In this embodiment, the virtual CD-ROM drive unit 46 comprises a data storage unit 52, a reading instruction receiving unit 54, an instruction conversion unit 56, an output request output unit 58, a data obtaining unit 60, a determination unit 62, a data expansion unit 64, and a data output unit 66.

The cloud service 10 is constituted using a computer mainly, as described above, and execution of a program installed in the computer constituting the cloud service 10 can realize respective functional components of the cloud service 10, as shown in FIG. 3. The program is supplied to the cloud service 10 via, e.g., a computer readable information storage medium, such as, e.g., a CD-ROM, a DVD-ROM, and so forth, or a communication network, such as the Internet or the like. Meanwhile, the client 12 is constituted using a computer mainly as described above, and execution of a program installed in the client 12 can realize respective functional components of the client 12, as shown in FIG. 3. The program is supplied to the client 12 via, e.g., a computer readable information storage medium, such as a CD-ROM, a DVD-ROM, and so forth, or a communication network, such as the Internet or the like.

In this embodiment, an image file, or a disk image of a CD-ROM, is stored beforehand in the image file storage unit 30. The image file is composed of a plurality of sectors, and contains a game program, image data, and audio data. In this embodiment, the audio data contained in the image file is classified into data on music, such as BGM, and data on sound effects. In this embodiment, music data is allocated as data in the CD-DA format in a CD-DA area, or a specific area in the image file, while sound effects data is contained as data in XA format (4-bit ADPCM data based on XA) in the image file. In this embodiment, music data comprises, in addition to PCM data obtained by sampling sound, a plurality of frame data (98 frames corresponding to one sector) each being 588-bit data and containing a frame synchronizing signal, a parity, and sub-coding including information on the absolute time from the beginning of the first piece (including a frame number) and information on a period of time elapsed in a track, and so forth. Thus, frame data and a sector that contains the frame data can be specified based on information on a corresponding absolute time from the beginning of the first piece.

In this embodiment, in response to a request from the client 12, the cloud service 10 can send a part of an image file (a part corresponding to one track, a part corresponding to images or game configuration data used for one stage, apart corresponding to data on game configuration, and so forth, in this embodiment) to the client 12. A part of the image file which the cloud service 10 can output to the client 12 at one time will be hereinafter referred to as a partial image file. Each partial image file may be stored as a separate file in the image file storage unit 30.

In this embodiment, the image file includes head address data that identifies the head address of the CD-DA area (a head sector in this embodiment), and an area at and after the address identified by the head address data is used as the CD-DA area.

In this embodiment, when a user sends a game start request from the client 12 to the cloud service 10, the emulator managing unit 32 starts the emulator 24 installed in the client 12 of the user in response to the start request, and loads the image file of a game program stored in the image file storage unit 30 into the emulator 24 started. Then, the game executing unit 50 starts executing the game program loaded. In this manner, a user of the client 12 can enjoy a game in this embodiment.

In this embodiment, the image file includes beforehand an image file management data including, as to each BGM, a start position data, request conversion rule data, and CD-DA sector range data. Specifically, the start position data indicates a start position in a CD-ROM (e.g., a cue file or the like indicating an absolute time related to a start position in each truck (e.g., minutes, seconds, and the number of frames from the beginning of the CD-DA area)). The request conversion rule data describes a conversion rule related to a start position and a parameter in an output request for outputting an image file stored in the image file storage unit 30 (e.g., data on correspondence correlation between an absolute time related to a start position and a parameter in an HTTP request, or the like). The CD-DA sector range data indicates the range of sectors corresponding to the CD-DA area in the CD-ROM. The image file management data is recorded in, e.g., TOC (Table of contents) in the image file.

The request conversion rule data according to this embodiment is, e.g., data correlating the range of a frame number in the CD-ROM and a parameter for requesting output of a partial image file that contains address range data (e.g., an identifier of the partial image file or the like).

In this embodiment, the cloud service 10 can send only the image file management data contained in the image file to the client 12. Specifically, in this embodiment, the cloud service 10 sends the image file management data to the client 12 at the beginning of a game, and the client 12 outputs the image file management data received from the cloud service 10 to the data storage unit 52 of the virtual CD-ROM drive unit 46.

In this embodiment, upon occurrence of a predetermined event in a game, such as encounter with an opponent, clearing a stage, starting a new stage, and so forth, where music such as BGM or the like is to be played, the game executing unit 50 outputs a reading instruction to read audio data on music, such as BGM or the like, to the virtual CD-ROM drive unit 46, and the game executing unit 50 thereupon plays the audio data, such as BGM or the like, read from the virtual CD-ROM drive unit 46.

In this embodiment, referring to the start position data, the game executing unit 50 specifies the identifier of a sector in a CD-ROM that corresponds to the start position of the BGM to be played, and then outputs a reading instruction to read an image file correlated to the identifier of the specified sector to the virtual CD-ROM drive unit 46.

Meanwhile, upon occurrence of a scene in a game where sound effects data, image data, and game configuration data are needed, the game executing unit 50 specifies the identifier of a sector where such data is allocated in the CD-ROM, and outputs a reading instruction to read data correlated to the identifier of the sector to the virtual CD-ROM drive unit 46.

Figure 4:
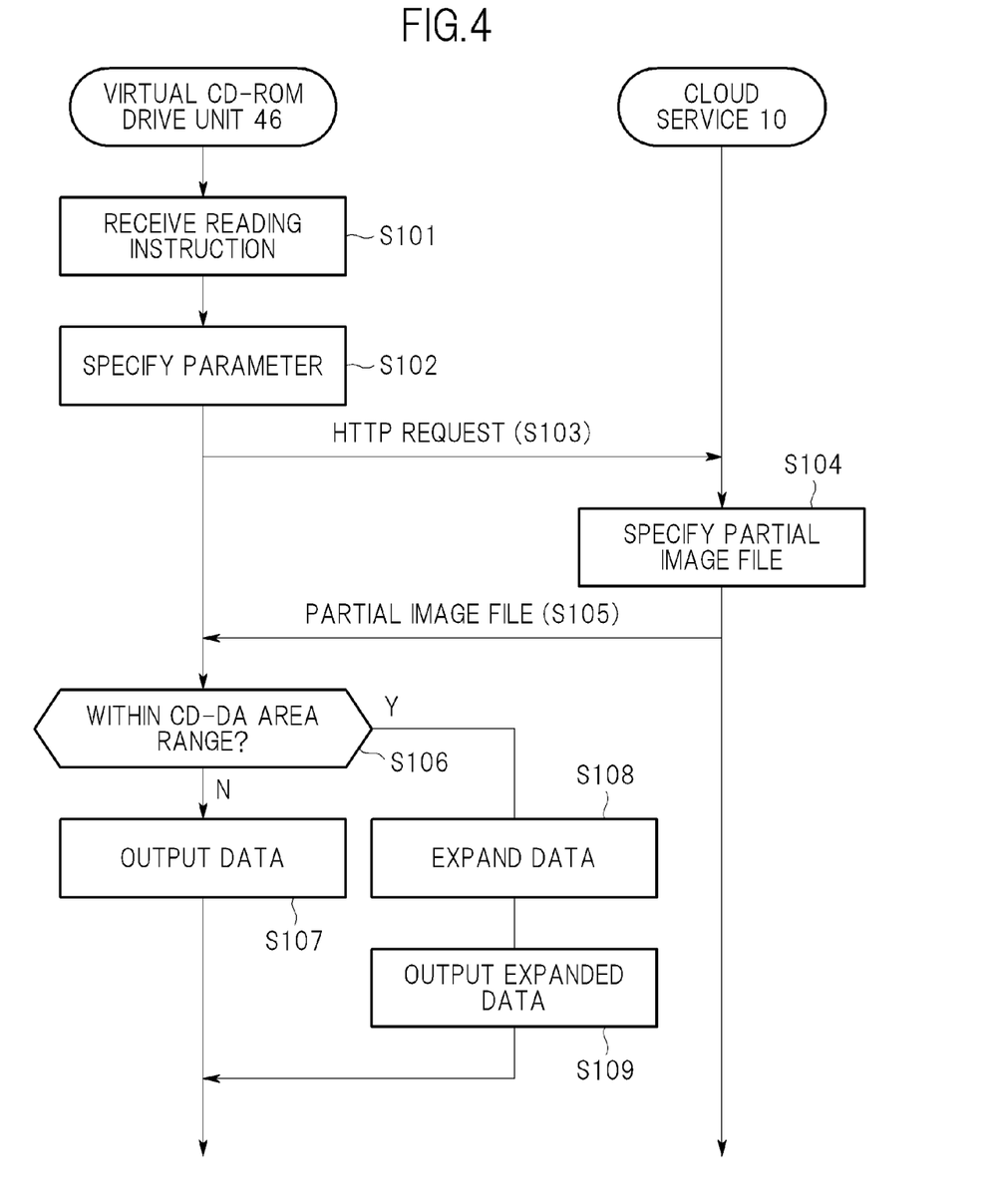
FIG. 4 is a flowchart of one example flow of a processing executed in a virtual CD-ROM drive unit of a client and the cloud service according to this embodiment.

Below, an example flow of data output executed in the virtual CD-ROM drive unit 46 of the client 12 and the cloud service 10 according to this embodiment in response to a reading instruction from the game executing unit 50 will be described referring to the flowchart shown in FIG. 4.

Initially, the reading instruction receiving unit 54 receives a reading instruction correlated to the identifier of a sector in the CD-ROM from the game executing unit 50 (S101). Then, the instruction conversion unit 56 specifies a parameter to be contained in an output request addressed to the cloud service 10, based on the identifier of the sector correlated to the reading instruction, with reference to the request conversion rule data (S102). In this embodiment, e.g., the identifier of a partial image file is specified.

Thereafter, the output request output unit 58 outputs an output request containing the parameter specified in the process at S102 to the cloud service 10. In this embodiment, the output request output unit 58 sends, e.g., an HTTP request containing the identifier of a partial image file as a parameter to the cloud service 10. The output request receiving unit 34 receives the output request (S103).

In this manner, in this example of the processing, a reading instruction to read a CD-ROM stored in the virtual CD-ROM drive unit 46 of a local machine (client 12) is converted into an HTTP request addressed to a remote machine (cloud service 10).

Thereafter, the data output unit 36 of the cloud service 10 specifies a partial image file to be output, based on the identifier of the partial image file contained as a parameter in the output request addressed to the cloud service 10 (S104). The data output unit 36 of the cloud service 10 then outputs the partial image file to the client 12, and the data obtaining unit 60 obtains the partial image file (S105). In this embodiment, as music data is stored compressed in the image file storage unit 30, the data obtaining unit 60 obtains a compressed partial image file in the process at S105.

Thereafter, referring to the CD-DA sector range data, the determination unit 62 determines whether or not the sector correlated to the reading instruction received in the process at S101 is within the CD-DA area range (S106).

When the sector is not within the CD-DA area range (S106: N), data within the sector correlated to the reading instruction received in the process at S101 among the data obtained in the process at S105 is output to the game executing unit 50 (S107), to thereby terminate the processing described in this example of the processing. Meanwhile, when the sector is within the CD-DA area range (S106: Y), the data expansion unit 64 expands the data obtained in the process at S105 (S108), and among the data expanded in the process at S108, the data output unit 66 of the client 12 outputs data in the sector correlated to the reading instruction received in the process at S101 to the game executing unit 50 (S109), to thereby terminate the processing described in this example of the processing.

Note that, in the above-described example of the processing, the processing of determining whether or not a sector correlated to the reading instruction received in the process at S101 is within the CD-DA area range may be executed not at the time at S106 but immediately after the process at S101.

Generally, data on music such as BGM or the like tends to be larger in size than image data or game configuration data. However, in this embodiment, as data on music such as BGM or the like is stored compressed in the image file storage unit 30, it is possible to reduce the possibility of bandwidth tightening in the computer network 14 due to a large amount of data flowing into the computer network 14 in reproduction of data on music, such as BGM or the like. Further, in this embodiment, data expansion in the client 12 is unnecessary for data not compressed. This can prevent increase of a processing load in the client 12. As described above, according to this embodiment, it is possible to reduce the possibility of bandwidth tightening in the computer network 14 due to reading of data from the cloud service 10 connected via the computer network 14, while reducing increase of a processing load in the client 12.

Note that the present invention is not limited to the above-described embodiment.

For example, the whole compressed data allocated in the CD-DA area in the image file may be stored as one file in the image file storage unit 30. Then, upon receipt by the reading instruction receiving unit 54, of a reading instruction correlated to the identifier of a sector in the CD-DA area range, the data obtaining unit 60 may obtain a file corresponding to all of the compressed data allocated in the CD-DA area, and the data expansion unit 64 may expand the file.

Further, for example, compressed data may be stored in an area other than the CD-DA area in the image file, and upon receipt of compressed data by the data obtaining unit 60, the data expansion unit 64 may expand the data. Note that the data output unit 66 may output compressed data to the virtual CPU unit 40, so that the virtual CPU unit 40 expands the data, rather than the data expansion unit 64 expanding the data.

Further, for example, data correlating the range of a start position in the CD-ROM and the identifier of a corresponding partial image file may be stored for each BGM in the image file storage unit 30. In this case, the output request output unit 58 may send an output request correlated to a parameter indicating the start position in the CD-ROM to the cloud service 10, and the cloud service 10 may send a partial image file specified based on the parameter correlated to the output request, to the client 12.

Further, for example, the game executing unit 50 may output data indicating a start position of BGM to the virtual CD-ROM drive unit 46, and the virtual CD-ROM drive unit 46 may specify the identifier of a sector in the CD-ROM corresponding to the start position.

Although data allocated in the CD-DA area is stored compressed in the image file storage unit 30 in the above-described embodiment, for example, large volume data that may possibly cause bandwidth tightening in the computer network 14 when flowing through the computer network 14 (e.g., a motion image or the like) may be stored compressed in the image file storage unit 30. In this case, as to the data stored compressed, the data output unit 66 of the client 12 may output the data to the game executing unit 50 after the data expansion unit 64 expands the compressed data.

Further, for example, music configuration data indicating whether to play original music or alternative music may be stored in the data storage unit 52. In this case, in the case the music configuration data indicates playing original music, the data output unit 66 of the client 12 may output music data stored in the image file storage unit 30 to the game executing unit 50 according to the processing described in the above described example of the processing, and in the case the music configuration data indicates playing alternative music, the data output unit 66 may output audio data of music data stored beforehand in the data storage unit 52 to the game executing unit 50. As the game executing unit 50 plays audio data output from the data output unit 66 of the client 12, when the music configuration data indicates playing alternative music, BGM that is different from the original music is played. With this arrangement, a user can enjoy a game, listening to BGM different from the original music, depending on a configuration, and also the amount of data flowing through the computer network 14 can be reduced.

Further, in response to a configuration so as not to output sound, such as when, e.g., the client 12 receives a user operation of restricting sound output (mute operation), the output request output unit 58 may not output an audio data output request to the cloud service 10 even though the reading instruction receiving unit 54 receives a reading instruction to read data on music, such as BGM or the like, from the game executing unit 50. With this arrangement, as no partial image file flows through the computer network 14, it is possible to reduce the amount of data flowing through the computer network 14.

Further, when the reading instruction receiving unit 54 receives a reading instruction to read audio data in a partial image file that is already received from the cloud service 10 and stored in the data storage unit 52, the data output unit 66 of the client 12 may output the partial image file stored in the data storage unit 52 to the game executing unit 50. This can prevent the partial image file already stored in the data storage unit 52 from being transmitted again from the cloud service 10 to the client 12.

Further, data transmission from the cloud service 10 to the client 12 may be executed in units of a sector.

Further, the above described game execution and data reading are not necessarily executed in the emulator 24, and may be executed over system software, such as, e.g., an operating system or the like, of the cloud service 10 or the client 12. Further, roles of the cloud service 10 and the client 12 are not limited to the above described example.

Further, note that the above described specific numbers, character strings, and those in the drawings are only examples, and not limiting.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An information processing device, comprising:
   an emulated media drive established on a client, the emulated drive emulating a physical media drive configured to read a physical medium containing data stored in a compressed data storage range and data stored in an uncompressed data storage range;
   a receiving unit of the emulated drive, the receiving unit being configured to receive, from an emulated central processing unit, a reading instruction to read the medium, and to cause the instruction to function as an instruction to read an image file of the medium, the image file being stored at an image file storage range on an external storage device of a server, the server being connected to the client via a network;
   a data obtaining unit of the emulated drive, the data obtaining unit being configured to obtain data of the image file from a designated range of the image file storage range, the designated range being designated by the medium reading instruction;
   a determination unit of the emulated drive, the determination unit being configured to determine whether the designated range is within the compressed data storage range or the uncompressed data storage range; and
   a data output unit of the emulated drive, the data output unit being configured to output the obtained data to the emulated central processing unit,
   wherein
   when the medium reading instruction designates a designated range that is within the compressed data storage range, the data obtaining unit obtains the data stored in the compressed data storage range of the image file storage range, the determination unit determines that the designated range is within the compressed data storage range, and the data output unit first expands the obtained data and then outputs the obtained data; and wherein
   when the medium reading instruction designates a designated range that is within the uncompressed data storage range, the data obtaining unit obtains the data stored in the uncompressed data storage range of the image file storage range, the determination unit determines that the designated storage range is within the uncompressed data storage range, and the data output unit outputs the obtained data without first expanding the data.

2. The information processing device according to claim 1, wherein
   the image file is an image file of an information storage medium where data allocated in a specific area in the information storage medium is stored compressed, and data allocated in an area other than the specific area is stored not compressed, and the image file is stored in the external storage device,
   the receiving unit receives the reading instruction, which is a reading instruction to read the image file, and
   when the reading instruction is a reading instruction to read data stored in the specific area, the data obtaining unit obtains the data, compressed, designated by the reading instruction, and the data output unit outputs data obtained by expanding the compressed data.

3. The information processing device according to claim 1, wherein the data output unit switches between outputting data stored in the external storage device and outputting data stored in the information processing device according to a configuration.

4. The information processing device according to claim 1, further comprising an expansion unit configured to expand the compressed data obtained by the data obtaining unit when the reading instruction is a reading instruction to read data stored compressed in the external storage device connected via the network,
   wherein
   when the reading instruction is a reading instruction to read data stored compressed in the external storage device connected via the network, the data output unit outputs data expanded by the expansion unit.

5. The information processing device according to claim 1, wherein
   the information processing device and the external storage device are connected to each other via the Internet,
   the information processing device further comprises
      a conversion unit configured to convert an address of the data designated by the reading instruction into a parameter in a request according to an Internet protocol, and
      a request output unit configured to output the request according to the Internet protocol containing the parameter to the external storage device, and
   the data obtaining unit obtains data output from the external storage device in response to the request.

6. An information processing device, comprising:
   an emulated CD drive established on a client, the emulated drive emulating a physical CD drive configured to read a physical CD containing data stored in a CD-DA data storage range and data stored in an uncompressed data storage range;
   a receiving unit of the emulated drive, the receiving unit being configured to receive, from an emulated central processing unit, a reading instruction to read the CD, and to cause the instruction to function as an instruction to read an image file of the CD, the image file being stored at an image file storage range on an external storage device of a server, the server being connected to the client via a network;

a data obtaining unit of the emulated drive, the data obtaining unit being configured to obtain data of the image file from a designated range of the image file storage range, the designated range being designated by the CD reading instruction; and an executing unit of the emulated drive, the executing unit being configured to execute a first processing and a second processing with respect to the data from the designated range, wherein the executing unit executes the first processing or the second processing, depending on whether or not the designated range is in the CD-DA data storage range or the uncompressed data storage range.

7. The information processing device according to claim 6, wherein the data in the area formatted according to the CD-DA format in the image file is stored compressed in the external storage device, and when the reading instruction is a reading instruction to read data in an area formatted according to the CD-DA format in the image file, the data obtaining unit obtains the data, compressed, designated by the reading instruction, and the executing unit outputs data obtained by expanding the compressed data.

8. An information processing system, comprising:

an information processing device and an external storage device, both connected via a network, wherein the external storage device includes a storing unit configured to store, at an image file storage range on the external storage device, an image file of a physical medium in which data allocated in a specific area in the medium is stored compressed and data allocated in an area other than the specific area in the medium is stored not compressed;

an output request receiving unit configured to receive an output request for outputting data, from the information processing device; and a data output unit configured to output the data stored in the image file to the information processing device in response to the output request, the information processing device includes an emulated media drive established on a client, the emulated drive emulating a physical media drive configured to read the medium;

a receiving unit of the emulated drive, the receiving unit being configured to receive, from an emulated central processing unit, a reading instruction to read the medium, and to cause the instruction to function as an instruction to read the image file of the medium;

a request output unit of the emulated drive, the request output unit being configured to output an output request for outputting data designated by the medium reading instruction to the external storage device;

a data obtaining unit of the emulated drive, the data obtaining unit being configured to obtain data of the image file from a designated range of the image file storage range, the designated range being designated by the medium reading instruction;

a determination unit of the emulated drive, the determination unit being configured to determine whether the designated range is within the specific area or the area other than the specific area; and a data output unit of the emulated drive, the data output unit being configured to output the obtained data to the emulated central processing unit, and when the medium reading instruction designates a designated range that is within the specific area, the request output unit outputs an output request for outputting the data, compressed, to the external storage device, and the data output unit outputs the data, compressed, to the information processing device, the data obtaining unit obtains the data stored in the compressed data storage range, the determination unit determines that the designated range is within the specific area, and the data output unit first expands the obtained data and then outputs the obtained data; and when the medium reading instruction designates a designated range that is within the area other than the specific area, the request output unit outputs an output request for outputting the data, uncompressed, to the external storage device, and the data output unit outputs the data, uncompressed, to the information processing device, the data obtaining unit obtains the data stored in the area other than the specific area, the determination unit determines that the designated range is within the area other than the specific area, and the data output unit outputs the obtained data without first expanding the data.

9. An information processing system, comprising an information processing device and an external storage device, both connected via a network, wherein the external storage device includes a storing unit configured to store, at an image file storage range on the external storage device, an image file of a physical CD containing data stored in a CD-DA data storage range and data stored in an uncompressed data storage range;

an output request receiving unit configured to receive an output request for outputting data, from the information processing device; and a data output unit configured to output data stored in the image file to the information processing device in response to the output request, the information processing device includes an emulated CD drive established on a client, the emulated drive emulating a physical CD drive configured to read the CD;

a receiving unit of the emulated drive, the receiving unit being configured to receive, from an emulated central processing unit, a reading instruction to read the CD, and to cause the instruction to function as an instruction to read the image file of the CD;

a request output unit of the emulated drive, the request output unit being configured to output an output request for outputting data designated by the CD reading instruction to the external storage device;

a data obtaining unit of the emulated drive, the data obtaining unit being configured to obtain the data of the image file from a designated range of the image file storage range, the designated range being designated by the CD reading instruction; and a executing unit of the emulated drive, the executing unit being configured to execute a first processing and a second processing with respect to the data from the designated range, and the executing unit executes the first processing or the second processing, depending on whether or not the designated range is in the CD-DA data storage range or the uncompressed data storage range.

10. An information processing method, comprising:

an establishing step of establishing, on a client, an emulated media drive emulating a physical media drive configured to read a physical medium containing data stored in a compressed data storage range and data stored in an uncompressed data storage range;

a receiving step of receiving, from an emulated central processing unit, a reading instruction to read the medium, and causing the instruction to function as an instruction to read an image file of the medium, the image file being stored at an image file storage range on an external storage device of a server, the server being connected to the client via a network;

a data obtaining step of obtaining data of the image file from a designated range of the image file storage range, the designated range being designated by the medium reading instruction;

a determination step of determining whether the designated range is within the compressed data storage range or the uncompressed data storage range; and a data output step of outputting the obtained data to the emulated central processing unit, wherein when the medium reading instruction designates a designated range that is within the compressed data storage range, the data stored in the compressed data storage range of the image file storage range is obtained at the data obtaining step, a determination that the designated range is within the compressed data storage range is made at the determination step, and data obtained by first expanding the compressed data is output at the data output step; and wherein when the medium reading instruction designates a designated range that is within the uncompressed data storage range, the data stored in the uncompressed data storage range of the image file storage range is obtained at the data obtaining step, a determination that the designated range is within the uncompressed data storage range is made at the determination step, and data obtained without first expanding the data is output at the data output step.

11. An information processing method, comprising:

an establishing step of establishing, on a client, an emulated CD drive emulating a physical CD drive configured to read a physical CD containing data stored in a CD-DA data storage range and data stored in an uncompressed data storage range;

a receiving step of receiving, from an emulated central processing unit, a reading instruction to read the CD, and causing the instruction to function as an instruction to read an image file of the CD, the image file being stored at an image file storage range on an external storage device of a server, the server being connected to the client via a network;

a data obtaining step of obtaining data of the image file from a designated range of the image file storage range, the designated range being designated by the CD reading instruction; and an executing step of executing a first processing or a second processing with respect to the data from the designated range, wherein the first processing or the second processing is executed at the executing step, depending on whether or not the designated range is in the CD-DA data storage range or the uncompressed data storage range.

12. A non-transitory computer-readable information storage medium storing a program for causing a computer to function as:

a receiving unit of an emulated media drive established on a client, the emulated drive emulating a physical media drive configured to read a physical medium containing data stored in a compressed data storage range and data stored in an uncompressed data storage range, the receiving unit being configured to receive, from an emulated central processing unit, a reading instruction to read the medium, and to cause the instruction to function as an instruction to read an image file of the medium, the image file being stored at an image file storage range on an external storage device of a server, the server being connected to the client via a network;

a data obtaining unit of the emulated drive, the data obtaining unit being configured to obtain data of the image file from a designated range of the image file storage range, the designated range being designated by the medium reading instruction;

a determination unit of the emulated drive, the determination unit being configured to determine whether the designated range is within the compressed data storage range or the uncompressed data storage range; and a data output unit of the emulated drive, the data output unit being configured to output the obtained data to the emulated central processing unit, wherein when the medium reading instruction designates a designated range that is within the compressed data storage range, the data obtaining unit obtains the data stored in the compressed data storage range of the image file storage range, the determination unit determines that the designated range is within the compressed data storage range, and the data output unit first expands the obtained data and then outputs the obtained data; and wherein when the medium reading instruction designates a designated range that is within the uncompressed data storage range, the data obtaining unit obtains the data stored in the uncompressed data storage range of the image file storage range, the determination unit determines that the designated range is within the uncompressed data storage range, and the data output unit outputs the obtained data without first expanding the data.

13. A non-transitory computer-readable information storage medium storing a program for causing a computer to function as:

a receiving unit of an emulated CD drive established on a client, the emulated drive emulating a physical CD drive configured to read a physical CD containing data stored in a CD-DA data storage range and data stored in an uncompressed data storage range, the receiving unit being configured to receive, from an emulated central processing unit, a reading instruction to read the CD, and to cause the instruction to function as an instruction to read an image file of the CD, the image file being stored at an image file storage range on an external storage device of a server, the server being connected to the client via a network;

a data obtaining unit of the emulated drive, the data obtaining unit being configured to obtain data of the image file from a designated range of the image file storage range, the designated range being designated by the CD reading instruction; and an executing unit of the emulated drive, the executing unit being configured to execute a first processing and a second processing with respect to the data from the designated range, wherein
the executing unit executes the first processing or the second processing, depending on whether or not the designated range is in the CD-DA data storage range or the uncompressed data storage range.

14. The information storage device of claim 1, wherein a data storage unit of the emulated drive contains music configuration data, the configuration data indicating whether to play original music or alternative music, and when the configuration data indicates original music, the data output unit outputs audio data of the image file, and when the configuration data indicates alternative music, the data output unit outputs audio data stored beforehand in the data storage unit.

15. The information storage device of claim 1, wherein an output request output unit of the emulated drive, in response to a configuration to not output sound, does not output an audio data output request to the cloud service when the receiving unit receives a medium reading instruction to read audio data from the medium.

16. The information storage device of claim 1, wherein when the receiving unit receives a medium reading instruction to read from the medium audio data that has been obtained from the image file storage area and stored in the data storage unit, the data output unit outputs the already obtained audio data from the data storage unit.

* * * * *